(12) United States Patent
 Fuderer

(10) Patent No.: US 12,618,925 B2
(45) Date of Patent: May 5, 2026

(54) MR IMAGING WITH SPIRAL ACQUISITION

(71) Applicant: KONINKLIJKE PHILIPS N.V., Eindhoven (NL)

(72) Inventor: Miha Fuderer, Bunnik (NL)

(73) Assignee: Koninklijke Philips N.V., Eindhoven (NL)

( * ) Notice: Subject to any disclaimer, the term of this patent is extended or adjusted under 35 U.S.C. 154(b) by 253 days.

(21) Appl. No.: 18/035,949

(22) PCT Filed: Nov. 2, 2021

(86) PCT No.: PCT/EP2021/080301
 § 371 (c)(1),
 (2) Date: May 9, 2023

(87) PCT Pub. No.: WO2022/101050
 PCT Pub. Date: May 19, 2022

(65) Prior Publication Data
 US 2023/0417850 A1     Dec. 28, 2023

(30) Foreign Application Priority Data

Nov. 10, 2020    (EP) .................................... 20206585

(51) Int. Cl.
  *G01R 33/48*      (2006.01)
  *G01R 33/565*     (2006.01)
(52) U.S. Cl.
  CPC ...  *G01R 33/4826* (2013.01); *G01R 33/56563* (2013.01)
(58) Field of Classification Search
  CPC .......... G01R 33/4826; G01R 33/56563; G01R 33/4824
  See application file for complete search history.

(56) References Cited

U.S. PATENT DOCUMENTS

| | | | | | |
|---|---|---|---|---|---|
| 5,604,434 A | * | 2/1997 | Schomberg | ........ | G01R 33/4824 |
| | | | | | 324/309 |
| 6,400,152 B1 | | 6/2002 | Cline et al. | | |

(Continued)

FOREIGN PATENT DOCUMENTS

| | | |
|---|---|---|
| EP | 3540453 A1 | 9/2019 |
| JP | 07284485 A | 10/1995 |

(Continued)

OTHER PUBLICATIONS

Chang et al."3D Accelerated Stack of Spirals Aquisitions and Reconstruction of Arterial Spin Labeling MRI" Magnetic Res in Med. vol. 78, No. 4, Nov. 3, 2016 p. 1405-1419.

(Continued)

*Primary Examiner* — Rishi R Patel

(57) ABSTRACT

The invention relates to a method of MR imaging of an object (10) positioned in an examination volume of a MR device (1). It is an object of the invention to enable efficient spiral MR imaging without blurring artefacts, even in situations of strong $B_0$ inhomogeneity. The method of the invention comprises the following steps: —subjecting the object (10) to an imaging sequence comprising at least one RF excitation pulse and modulated magnetic field gradients, —acquiring MR signals along two or more planar spiral k-space trajectories (31, 32, 33), wherein the radial k-space speed, i.e. the rate of variation of the radial distance from the spiral origin is essentially constant along each planar spiral k-space trajectory, and wherein the two or more k-space trajectories (31, 32, 33) are offset in-plane from each other, and—reconstructing an MR image from the acquired MR signals. Moreover, the invention relates to a MR device (1) and to a computer program for a MR device (1).

10 Claims, 2 Drawing Sheets

(56) References Cited

U.S. PATENT DOCUMENTS

| 6,411,089 | B1 |  | 6/2002 | Anand et al. |  |
|---|---|---|---|---|---|
| 6,549,008 | B1 |  | 4/2003 | Anand et al. |  |
| 7,719,270 | B2 |  | 5/2010 | Krueger |  |
| 8,148,980 | B2 |  | 4/2012 | Kitamoto |  |
| 8,306,289 | B1 | * | 11/2012 | Meyer ................ | G01R 33/5611 |
|  |  |  |  |  | 382/128 |
| 2007/0182412 | A1 | * | 8/2007 | Katscher ............ | G01R 33/4824 |
|  |  |  |  |  | 324/309 |
| 2014/0133716 | A1 |  | 5/2014 | Zenge |  |
| 2014/0152304 | A1 |  | 6/2014 | Fielden et al. |  |
| 2014/0218028 | A1 |  | 8/2014 | Snyder et al. |  |
| 2015/0234024 | A1 |  | 8/2015 | Grodzki et al. |  |

FOREIGN PATENT DOCUMENTS

| KR | 1020130013817 | B1 | 2/2013 |
|---|---|---|---|
| WO | 03098267 | A1 | 11/2003 |
| WO | 03100378 | A2 | 12/2003 |
| WO | 2019174964 | A1 | 9/2019 |

OTHER PUBLICATIONS

International Search Report and Written Opinion from PCT/ EP2021/ 080301 mailed Jan. 19, 2022.
Gomez Pedro A. et al: "Rapid three-dimensional multiparametric MRI with quantitative transient-state imaging", Scientific Reports, vol. 10, No. 1, Aug. 13, 2020 (Aug. 13, 2020), XP093143820, US ISSN: 2045-2322, DOI: 10.1038/s41598-020-70789-2 Retrieved from the Internet: URL:https://www.nature.com/articles/ s41598-020-70789-2.

* cited by examiner

MR IMAGING WITH SPIRAL ACQUISITION

CROSS REFERENCE TO RELATED APPLICATIONS

This application is a U.S. national phase application of International Application No. PCT/EP2021/080301 filed on Nov. 2, 2021, which claims the benefit of EP Application No. 20206585.0 filed on Nov. 10, 2020 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated, e.g., by means of a refocusing pulse (for example a 180° pulse). This produces an echo signal (spin echo) in the receiving coils.

To realize spatial resolution in the body, magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. A set of k-space data is converted to a MR image by means of an image reconstruction algorithm.

Spiral imaging is a fast MR imaging technique that benefits from an efficient k-space coverage and a low sensitivity to motion and flow artifacts. Spiral k-space trajectories allow for an efficient and temporally flexible sampling of k-space as shorter pathways are required to cover a desired k-space region, and the signal acquisition may start in the center of k-space. Spiral imaging techniques are, however, vulnerable to inhomogeneities in the amplitude of the main magnetic field $B_0$, which causes blurring and degrades the image quality. E.g., images obtained by spiral MR imaging of the brain are typically contaminated by off-resonance signal contributions from the sagittal sinus and nasal cavities. The strong magnetic field inhomogeneities may result in the shape of the true spiral k-space trajectories to deviate to such a large extent from the theoretical spiral shape that practically no usable signal data is sampled from certain regions of k-space. Magnetic field inhomogeneities induced by the patient anatomy may lead to local magnetic field gradients of up to 0.5μT/mm. In such cases, conventional single-shot spiral imaging (with sampling the full k-space region of interest along one spiral k-space trajectory after a single RF excitation) with a readout time of approximately 25 ms results in images showing artefacts that cannot be resolved by known de-blurring methods that apply post-processing phase corrections. It is known that the blurring artefacts can be reduced to a certain extent by shortening the readout time, in combination with interleaved multi-shot trajectories if necessary to obtain sufficient k-space coverage. However, this significantly reduces the efficiency of the method.

The US patent application US2014/0218028 discloses a spin echo implementation with a single Archimedean spiral sampling trajectory in k-space with constant radial velocity.

SUMMARY OF THE INVENTION

From the foregoing it is readily appreciated that there is a need for an improved MR imaging technique. It is an object of the invention to address the above-mentioned limitations and to enable efficient spiral MR imaging with a reduced level of artefacts, even in situations of strong $B_0$ inhomogeneity.

In accordance with the invention, a method of MR imaging of an object positioned in an examination volume of a MR device is disclosed. The method comprises:
- subjecting the object to an imaging sequence comprising at least one RF excitation pulse and modulated magnetic field gradients,
- acquiring MR signals along two or more planar spiral k-space trajectories, wherein the radial k-space speed, i.e. the rate of variation of the radial distance from the spiral origin is essentially constant along each planar spiral k-space trajectory, and wherein the two or more k-space trajectories are offset in-plane from each other, reconstructing an MR image from the acquired MR signals.

The invention is based on the insight that the artefacts caused by local $B_0$ inhomogeneities are related to the radial k-space speed of the planar spiral k-space acquisition. The artefacts occur in the presence of field inhomogeneities combined with a too slow progression of the sampling along the planar spiral k-space trajectory outward from the k-space center to its periphery. The sampling speed along the planar spiral k-space trajectory is limited towards the k-space periphery (due to limitations of the gradient hardware of the used MR apparatus). Hence, the conventional spiral sampling strategies need to slow down the radial speed of the spiraling with increasing distance from the k-space origin in order to obtain a sufficiently dense k-space coverage (typically employing Archimedean-type spiral trajectories). The invention, proposes to apply an essentially constant radial k-space speed along the whole spiral trajectory instead. As the progression speed along the trajectory is not slowed down according to the invention, the sampling density necessarily becomes low towards the k-space periphery. In order to nevertheless ensure a sufficient k-space density, the invention proposes to split the scanning into two or more mutually offset in-plane k-space spirals. As the k-space sampling progresses quickly along the spiral trajectories outward from the k-space center according to the invention, blurring artefacts in the presence of main magnetic field inhomogeneities are reduced to a significant extent without reducing the efficiency of the method.

The invention concerns a method of MR imaging of an object involving sampling of k-space along multiple spiral trajectories. In an outward sampling implementation, sampling of k-space is done along a current spiral trajectory that starts at a predetermined initial k-space position and continues outward until the current final k-space position at which the radial k-space sampling density falls below a current predetermined threshold value. Then, starting from a next initial k-space position a next spiral trajectory starts near the current final k-space position and continues outward until the current final k-space position at which the radial k-space sampling density falls below a next threshold value. Thus, over the concatenated multiple spiral trajectories the radial k-space speed remains above the predetermined current and next threshold values and is limited by the gradient system's capabilities. In the succession of spiral trajectories, the radial k-space sampling density does not fall below the current and next predetermined threshold values so that the radial k-space sampling density remains with a range limited by the threshold values and a nominal value associated with the gradient system's capabilities. By selecting the current and next threshold values in a narrow range below a nominal radial k-space speed associated with the gradient system's capabilities for gradient strength and slew rate, the radial k-space sampling density remains essentially constant over the concatenated k-space trajectories. The first of the spiral trajectories may start from (near) the origin of k-space. In a practical implementation the next initial k-space position coincides with or is a sampling distance away from the current final k-space position. The current predetermined threshold value and the next predetermined threshold values may be equal so that any residual variation of the radial k-space speed is similar from one spiral trajectory to the next.

In an inward sampling implementation, the current spiral trajectory starts from a start k-space position and continues inward to a current end k-space position. At the start k-space position the radial k-space sampling density is at least a current threshold value and the radial k-space sampling density increases to a current ceiling value at the current end k-space position. Then, starting from a next start k-space position near the current end k-space position the next spiral trajectory starts towards the next end k-space position. At the next start k-space position the radial k-space sampling density is at least a next threshold value and increases to a next ceiling value. In a practical implementation the next start k-space position coincides with or is a sampling distance away from the current end k-space position. The current predetermined ceiling value and the next predetermined ceiling. values may be equal so that any residual variation of the radial k-space sampling density is similar form one spiral trajectory to the next. These ceiling values may in practice be associated with gradient system's capabilities.

The k-space sampling along spiral trajectories may be implemented in an iterative manner in that subsequent to the next spiral trajectory a further next spiral trajectory is traversed. The more different spiral trajectories are employed, the smaller the variation of radial k-space sampling density over the concatenation of spiral trajectories or the larger the region of k-space sampled at a given (narrow) range of variation of the radial k-space sampling density.

From the acquired magnetic resonance signals a magnetic resonance image may be reconstructed. The reconstruction may be implemented as a reconstruction module in software installed on the host computer of the magnetic resonance examination system. Alternatively, the reconstruction may be done remotely, e.g. in the cloud separately in place and time from the magnetic resonance examination system and the acquisition of the MR signals. That is, the invention may include to arrange for a magnetic resonance image to be reconstructed from the magnetic resonance signal acquired by sampling of k-space along the spiral trajectories.

In a preferred embodiment, the MR signals are acquired along the two or more planar spiral k-space trajectories after a single RF excitation pulse. This corresponds to a single-shot implementation of the method of the invention. The two or more planar spiral k-space trajectories are acquired instantly after each other, following a single RF excitation. In terms of scanning efficiency, the method of the invention is thus identical to conventional single-shot spiral imaging approaches.

In another preferred embodiment, the origins of the two or more planar spiral k-space trajectories (i.e. their respective starting points in k-space) are offset in-plane from each other. In order to obtain the desired sufficiently dense k-space coverage, different origins of the two or more spiral trajectories may be employed. The in-plane offset origins lead to the two or more spiral trajectories being interleaved in k-space such that the sampling gaps of one trajectory are filled by another trajectory.

In yet another possible embodiment, the two or more planar spiral k-space trajectories are rotated relative to each other around their spiral axes. This also enables an interleaved set of planar spiral k-space trajectories with sufficiently dense k-space coverage.

According to a further embodiment, at least one of the planar spiral k-space trajectories is offset in-plane from k-space origin. It is sufficient if only one of the two or more k-space trajectories starts at the k-space origin. The starting points of the other spiral trajectories can be chosen freely to optimize the sampling density in the k-space periphery.

In an embodiment of the method of the invention, the distance (in radial direction) between the windings of the planar spiral k-space trajectories grows with increasing distance from the spiral origin. This comes as a consequence of the constant radial speed of the spiral k-sampling in combination with inevitable gradient limitations. Hence, the spiral trajectories employed according to the invention will generally not be of the Archimedean type.

According to yet another preferred embodiment, a $B_0$ map is derived by comparing the MR signals acquired along the different planar spiral k-space trajectories. MR images may be reconstructed from the MR signals of each individual planar spiral k-space trajectory (ideally limited to a central k-space region with sufficient sampling density). The $B_0$ map can be derived by comparing the different phases of the reconstructed images. The final MR image can then be reconstructed with correction of $B_0$ inhomogeneity based on the derived $B_0$ map. In a similar fashion, $T_2^*$ effects can be dealt with. The MR signals along the different spiral trajec-tories will be differently affected by $T_2^*$ relaxation. $T_2^*$ can be determined by comparing the MR signals of the different spiral trajectories and can then be used to correct the MR signals accordingly.

Within the meaning of the invention, a planar spiral k-space trajectory is defined as a curve that turns around an origin at continuously increasing or decreasing distance. This definition covers (inter alia) a spiral in three-dimen-sional k-space, such as a conical helix, that winds around an axis, as well as a curve in a plane that winds around a fixed center point at a continuously increasing (outward spiral) or decreasing (inward spiral) distance from the center point, i.e., a spiral in two-dimensional k-space where the center point constitutes the origin, i.e. the starting resp. end point of the spiral.

The MR signals may be acquired, e.g., as free induction decays (FID) immediately after the radiation of a respective RF excitation pulse. The MR signals may also be acquired as spin echo or gradient echo signals.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the recon-struction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however,

Figure 1:
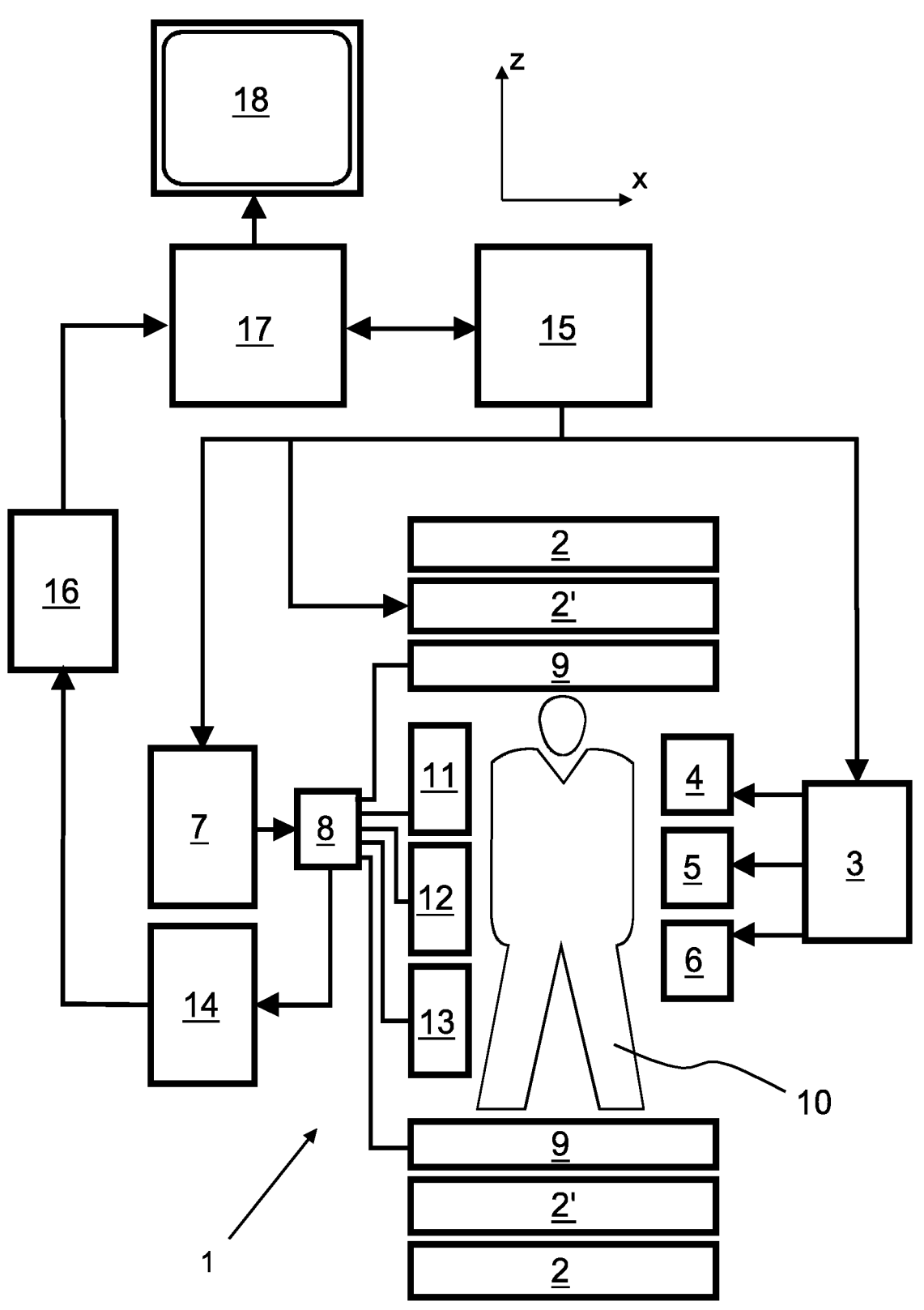
Figure 2:
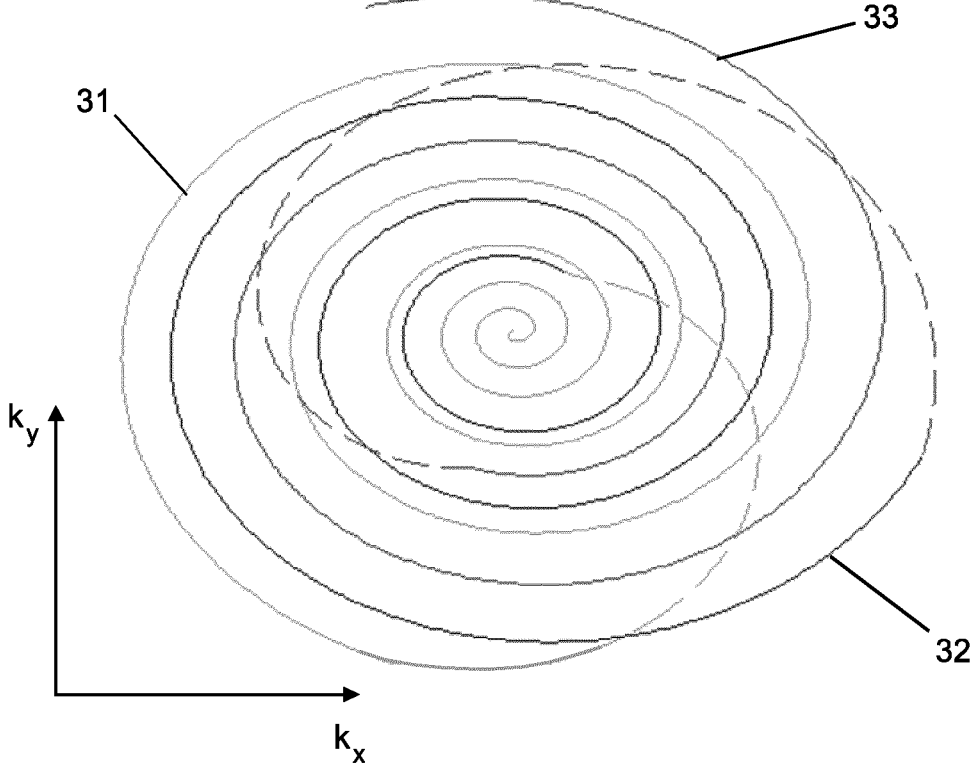

6 that the drawings are designed for the purpose of illustration only and not as a definition of the limits of the invention. In the drawings:

FIG. 1 shows a MR device for carrying out the method of the invention;

FIG. 2 shows a diagram of k-space illustrating the spiral sampling approach of the invention.

DETAILED DESCRIPTION OF THE EMBODIMENTS

With reference to FIG. 1, a MR device 1 is schematically shown. The device comprises superconducting or resistive main magnet coils 2 such that a substantially uniform, temporally constant main magnetic field is created along a z-axis through an examination volume.

A magnetic resonance generation and manipulation sys-tem applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear mag-netic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as gradient and spin echo imaging, fast spin echo (TSE) imaging, and the like to acquire the MR signals along spiral k-space trajectories according to the invention. For the selected sequence, the receiver 14 receives a single or a plurality of MR data along the respective k-space trajectories in rapid succession following each RF excitation pulse. A data acquisition system 16 performs analog-to-digital conversion of the received sig-nals and converts each MR signal to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies an interpolation or regridding of the data from the spiral acquisition prior to a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The MR device 1 is arranged, e.g. by appropriate programming of the host computer 15 and the reconstruction processor 17, to perform the imaging method of the invention as described herein above and in the following.

With continuing reference to FIG. 1 and with further reference to FIG. 2, an embodiment of the imaging approach of the invention is explained.

FIG. 2 illustrates the spiral acquisition strategy of the invention. The invention proposes to apply two or more planar spiral k-space trajectories 31, 32, 33, wherein the radial k-space speed, i.e. the rate of variation of the radial distance from the spiral origin is essentially constant along each planar spiral k-space trajectory, and wherein the two or more k-space trajectories 31, 32, 33 are offset in-plane from each other. The first planar spiral k-space trajectory is designated by reference number 31. In the k-space center, which coincides with the origin of spiral 31, the angular speed of sampling along the trajectory is high. However, the speed of progression along the spiral trajectory 31 is limited (due to the limited capabilities of the gradient system 3, 4, 5, 6 in terms of strength and slew rate) such that the angular speed decreases. If the spiral trajectory were of the Archimedean type (as in the prior art) then also the radial speed would decrease. As the radial speed of sampling along the spiral trajectory 31 is kept substantially constant according the invention, the shape of the trajectory 31 deviates from an Archimedean spiral and delivers a lower sampling density in the periphery of k-space. Here the sampling density becomes too low for obtaining the desired quality of the finally reconstructed MR image. To compensate for the decreased density, the sampling is split into two or more (in the depicted embodiment three) planar spiral k-space trajectories 31, 32, 33. After completion of sampling along the first trajectory 31 (which takes 10 ms in the depicted example) sampling transits (during, e.g., 0.7 ms, illustrated by the dashed curve) to the second trajectory 32. In the example, the second trajectory 32 does not start at the origin of k-space ($k_x=k_y=0$), but at a point where the sampling density of the first trajectory 31 falls below a given threshold, e.g. at a position that was passed by the first trajectory 31 after 3 ms from the beginning of the scan. Hence, the second trajectory requires only 7 ms to reach the outer limit of the required k-space region. The second trajectory 32 then transits to the start of the third trajectory 33 which takes 5 ms to reach the outer limit of the required k-space region. With the depicted planar spiral k-space sampling scheme, a substantially constant density of spiral arms 31, 32, 33 is achieved while keeping the radial k-space speed constant— and higher than with a conventionally applied single spiral k-space trajectory. In this way, the invention reduces the level of $B_0$ inhomogeneity-induced blurring artefacts in the finally reconstructed MR image without a significant negative impact on sampling efficiency.

In the presence of $B_0$ inhomogeneities, the MR signals acquired along the different planar spiral k-space trajectories 31, 32, 33 will accumulate different amounts of phase. Moreover, the MR signals of the different k-space trajectories 31, 32, 33 experience different $T_2^*$ effects. Intermediate MR images may be reconstructed from the MR signals acquired from a central k-space portion along the individual trajectories 31, 32, 33. A comparison of these images allow to obtain a $B_0$ map and $T_2^*$. With the knowledge of these parameters, the final MR image can be reconstructed from the MR signals of all three planar spiral k-space trajectories 31, 32, 33.

The invention claimed is:

1. A method of magnetic resonance (MR) imaging of an object positioned in an examination volume of an MR device, the method comprising:

subjecting the object to an imaging sequence comprising at least one RF excitation pulse and modulated magnetic field gradients, acquiring MR signals by sampling k-space along multiple planar spiral k-space trajectories in k-space traversed with a constant radial k-space speed, wherein a current spiral trajectory is traversed outward from a predetermined current initial k-space position until a current final k-space position such that at the current final k-space position a radial k-space sampling density decreases below a predetermined current threshold value, and a next spiral trajectory is traversed outward from a next initial k-space position until a next final k-space position such that the radial k-space sampling density decreases below a predetermined next threshold value at the next final k-space position and wherein the multiple planar spiral k-space trajectories are offset in-plane from an origin of k-space so as to each start at a different origin for enhancing the sampling density in a periphery of the k-space.

2. A method of magnetic resonance (MR) imaging of an object positioned in an examination volume of an MR device, the method comprising:

subjecting the object to an imaging sequence comprising at least one RF excitation pulse and modulated magnetic field gradients, acquiring MR signals by sampling k-space along multiple planar spiral k-space trajectories in k-space traversed with a constant radial k-space speed, wherein a current spiral trajectory is traversed inward from a predetermined start k-space position such that a radial k-space sampling density is at least a current threshold value until a current end k-space position at which the radial k-space sampling density increases to a current ceiling value, and a next spiral trajectory is traversed inward from a next start k-space position after the current end k-space position such that the radial k-space sampling density is at least a next threshold value until a next end k-space position at which the radial k-space sampling density reaches a next ceiling value and wherein the multiple planar spiral k-space trajectories are offset in-plane from an origin of k-space so as to each start at a different origin for enhancing the sampling density in a periphery of the k-space.

3. The method of claim 1, wherein the MR signals are acquired along the multiple planar spiral k-space trajectories after a single RF excitation pulse.

4. The method of claim 1, wherein origins of the multiple planar spiral k-space trajectories are offset in-plane from each other.

5. The method of claim 1, wherein the multiple planar spiral k-space trajectories are rotated relative to each other around their spiral axes.

6. The method of claim 1, wherein a distance between windings of the multiple planar spiral k-space trajectories increases with increasing distance from an origin of the spiral.

7. The method of claim 1, wherein a $B_0$ map is derived by comparing the MR signals acquired along different of the multiple planar spiral k-space trajectories.

8. The method of claim 7, wherein an MR image is reconstructed with correction of $B_0$ inhomogeneity based on the derived $B_0$ map.

9. A magnetic resonance (MR) device including at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling a temporal succession of RF pulses and switched magnetic field gradients, and a reconstruction unit for reconstructing a MR image from the received MR signals, wherein the MR device is arranged to perform either subjecting the object to an imaging sequence comprising at least one RF excitation pulse and modulated magnetic field gradients, acquiring MR signals by sampling k-space along multiple planar spiral k-space trajectories in k-space traversed with a constant radial k-space speed, wherein a current spiral trajectory is traversed outward from a predetermined current initial k-space position until a current final k-space position such that at the current final k-space position a radial k-space sampling density decreases below a predetermined current threshold value, and a next spiral trajectory is traversed outward from a next initial k-space position until a next final k-space position such that the radial k-space sampling density decreases below a predetermined next threshold value at the next final k-space position and wherein the multiple planar spiral k-space trajectories are offset in-plane from an origin of k-space so as to each start at a different origin for enhancing the sampling density in a periphery of the k-space, or, subjecting the object to an imaging sequence comprising at least one RF excitation pulse and modulated magnetic field gradients, acquiring MR signals by sampling k-space along the multiple planar spiral k-space trajectories in k-space traversed with a constant radial k-space speed, wherein a current spiral trajectory is traversed inward from a predetermined start k-space position such that a radial k-space sampling density is at least a current threshold value until a current end k-space position at which the radial k-space sampling density increases to a current ceiling value, and a next spiral trajectory is traversed inward from a next start k-space position after the current end k-space position such that the radial k-space sampling density is at least a next threshold value until a next end k-space position at which the radial k-space sampling density reaches a next ceiling value and wherein the multiple planar spiral k-space trajectories are offset in-plane from an origin of k-space so as to each start at a different origin for enhancing the sampling density in a periphery of the k-space.

10. A non-transitory computer-readable medium storing a computer program to be run on a magnetic resonance (MR) device, which computer program comprises instructions to:

subjecting an object to an imaging sequence comprising at least one RF excitation pulse and modulated magnetic field gradients, acquiring MR signals by sampling k-space along multiple planar spiral k-space trajectories in k-space traversed with a constant radial k-space speed, wherein a current spiral trajectory is traversed outward from a predetermined current initial k-space position until a current final k-space position such that at the current final k-space position the radial k-space sampling density decreases below a predetermined current threshold value, and a next spiral trajectory is traversed outward from a next initial k-space position until a next final k-space position such that the radial k-space sampling density decreases below a predetermined next threshold value at the next final k-space position and wherein the multiple planar spiral k-space trajectories are offset in-plane from an origin of k-space so as to each start at a different origin for enhancing the sampling density in a periphery of the k-space, or, subjecting the object to an imaging sequence comprising at least one RF excitation pulse and modulated magnetic field gradients, acquiring MR signals by sampling k-space along multiple planar spiral k-space trajectories in k-space traversed with a constant radial k-space speed, wherein a current spiral trajectory is traversed inward from a predetermined start k-space position such that the radial k-space sampling density is at least a current threshold value until a current end k-space position at which the radial k-space sampling density increases to a current ceiling value, and a next spiral trajectory is traversed inward from a next start k-space position after the current end k-space position such that the radial k-space sampling density is at least a next threshold value until a next end k-space position at which the radial k-space sampling density reaches a next ceiling value and wherein the multiple planar spiral k-space trajectories are offset in-plane from an origin of k-space so as to each start at a different origin for enhancing the sampling density in a periphery of the k-space.

* * * * *